United States Patent
Matsumoto et al.

(10) Patent No.: US 8,017,922 B2
(45) Date of Patent: Sep. 13, 2011

(54) ION IMPLANTATION METHOD AND APPARATUS

(75) Inventors: Takao Matsumoto, Kyoto (JP); Nobuo Nagai, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 29 days.

(21) Appl. No.: 10/840,281

(22) Filed: May 7, 2004

(65) Prior Publication Data

US 2005/0184254 A1 Aug. 25, 2005

(30) Foreign Application Priority Data

Feb. 23, 2004 (JP) .............................. P. 2004-046213

(51) Int. Cl.
*H01J 37/317* (2006.01)

(52) U.S. Cl. ............... 250/492.21; 250/492.2; 250/492.3

(58) Field of Classification Search .............. 250/492.21
See application file for complete search history.

(56) References Cited

U.S. PATENT DOCUMENTS

| | | | | |
|---|---|---|---|---|
| 4,449,051 A | * | 5/1984 | Berkowitz | 250/492.2 |
| 4,494,005 A | * | 1/1985 | Shibata et al. | 250/492.2 |
| 4,922,106 A | * | 5/1990 | Berrian et al. | 250/492.2 |
| 5,898,179 A | * | 4/1999 | Smick et al. | 250/492.21 |
| 6,055,460 A | | 4/2000 | Shopbell | |
| 6,323,497 B1 | * | 11/2001 | Walther | 250/492.21 |
| 6,657,209 B2 | * | 12/2003 | Halling | 250/492.21 |
| 6,750,462 B2 | * | 6/2004 | Iwasawa et al. | 250/492.3 |
| 7,049,210 B2 | * | 5/2006 | Murrell et al. | 438/535 |
| 2003/0155533 A1 | | 8/2003 | Iwasawa et al. | |

FOREIGN PATENT DOCUMENTS

| | | |
|---|---|---|
| EP | 1 047 101 A2 | 10/2000 |
| GB | 2 382 924 A | 6/2003 |
| JP | 03-074040 | 3/1991 |
| JP | 04-022900 | 1/1992 |
| JP | 2000-150407 | 5/2000 |
| JP | 2001-143651 | 5/2001 |
| JP | 2001-185071 | 7/2001 |
| JP | 2003 086530 A | 3/2003 |
| JP | 2003-132835 | 5/2003 |
| TW | 153534 | 5/1979 |
| TW | 483072 | 11/1999 |
| WO | WO 99/13488 | 3/1999 |

OTHER PUBLICATIONS

European Search Report for related European Application No. EP 04023084 dated Nov. 9, 2010.

* cited by examiner

*Primary Examiner* — Phillip A Johnston
(74) *Attorney, Agent, or Firm* — Finnegan, Henderson, Farabow, Garrett & Dunner, L.L.P.

(57) ABSTRACT

An ion implantation method includes scanning reciprocatingly an ion beam in an X direction by an electric field or magnetic field and mechanically driving reciprocatingly a substrate in a Y direction orthogonal to the X direction to implant ions over the entire surface of the substrate. A dose distribution that is non-uniform within the plane of the substrate is formed within the plane of the substrate by changing at least one of a scanning speed of the ion beam and a driving speed of the substrate within an area where the ion beam is incident on the substrate.

13 Claims, 11 Drawing Sheets

ION IMPLANTATION METHOD AND APPARATUS

This application claims the benefit of priority of Japanese Patent Application No. 2004-046213, filed Feb. 23, 2004, which is incorporated herein by reference.

BACKGROUND OF THE INVENTION

1. Field of the Invention

The present invention relates to an ion implantation method and apparatus for forming a dose (number of implanted ions per unit area) distribution that is not uniform within the plane of a substrate (e.g., semiconductor substrate).

2. Description of the Related Art

In the conventional ion implantation techniques, it was a main subject to evenly implant ions into the plane of the substrate. In recent years, there is a demand for forming a non-uniform dose distribution of desired pattern. The non-uniform dose distribution is the uneven dose distribution, or the dose distribution having different dose amounts in plural regions.

For example, in recent years, the processes in the manufacture of semiconductor devices such as LSI and memory are complicated, and the semiconductor substrates are larger in size, and very expensive. Therefore, it is very important to improve the yield in the manufacture of semiconductor devices. That is, it is very important to utilize one substrate as effectively as possible. To implement this, in an ion implantation process among a plurality of processes for manufacturing the semiconductor device, there are strong demands for correcting the characteristics of semiconductor device in a particular region of the semiconductor device formed within the plane of the substrate by making the dose distribution uneven at will within the plane of the substrate (referred to as an APC: Advanced Process Control), and changing the characteristics (e.g., threshold voltage Vth of FET) at will.

A technique meeting these demands is an ion implantation technique for forming a dose distribution that is different longitudinally and/or transversely around a central part of the substrate as the boundary as described in JP-A-2003-132835 (paragraphs 0011 to 0014, FIG. 4).

With the technique as described in the above-mentioned JP-A-2003-132835, the dose distribution is only varied necessarily around the central part of the substrate as the boundary, whereby various dose distributions can not be formed within the plane of the substrate.

By the way, to correct or change the characteristics of the semiconductor device is not always made around the central part of the substrate as the boundary, and the region for correcting or changing the characteristics must be varied, depending on various conditions such as situation of the treatment process. Thereby, the technique as described in the above-mentioned JP-A-2003-132835 can not sufficiently cope with the demands posed in recent years.

SUMMARY OF THE INVENTION

It is an object of this invention to provide an ion implantation method and apparatus capable of forming various dose distributions within the plane of the substrate.

According to this invention, there is provided an ion implantation method for implanting ions into a substrate, employing both the reciprocating scanning of an ion beam in an X direction by an electric field or magnetic field, and the mechanical reciprocating driving of the substrate in a Y direction almost orthogonal to the X direction, characterized by including forming a dose distribution that is non-uniform within a plane of the substrate by changing at least one of a scanning speed of the ion beam and a driving speed of the substrate within an area where the ion beam is incident on the substrate.

According to this invention, there is provided an ion implantation apparatus for implanting ions into a substrate, comprising a scan unit for scanning reciprocatingly an ion beam in an X direction by an electric field or magnetic field, and a drive unit for mechanically driving reciprocatingly the substrate in a Y direction almost orthogonal to the X direction, characterized by further comprising a control unit for controlling at least one of the scan unit and the drive unit to change at least one of a scanning speed of the ion beam and a driving speed of the substrate within an area where the ion beam is incident on the substrate to form a dose distribution that is non-uniform within a plane of the substrate.

The dose amount into the substrate is inversely proportional to the scanning speed of the ion beam, if the beam current density of the ion beam is constant. Accordingly, it is possible to form a dose distribution that is non-uniform within the plane of the substrate by changing at least one of the scanning speed of the ion beam and the driving speed of the substrate within an area where the ion beam is incident on the substrate. Moreover, various dose distributions can be formed within the plane of the substrate by appropriately selecting the pattern for changing the scanning or driving speed.

The dose distribution that is non-uniform within the plane of the substrate may be formed by changing at least one of the scanning speed of the ion beam and the driving speed of the substrate within an area where the ion beam is incident on the substrate, and rotating the substrate around the central part thereof.

Also, the dose distribution that is non-uniform within the plane of the substrate may be formed by performing an implantation process, multiple times, of implanting ions into the substrate by changing stepwise at least one of the scanning speed of the ion beam and the driving speed of the substrate while controlling the driving speed of the substrate to be inversely proportional to a beam current density of ion beam within an area where the ion beam is incident on the substrate, and a rotation process of rotating by a predetermined rotation angle the substrate around the central part thereof in an interval between each implantation process.

The dose distribution having different dose amounts between the central region and the peripheral region around the central region may be formed within the plane of the substrate by performing an implantation process, n (n is an integer of 2 or greater) times, of implanting ions into the substrate by changing stepwise the scanning speed of the ion beam from a first scanning speed to a second scanning speed different from the first scanning speed to the first scanning speed from one end of the substrate to the other, and a rotation process of rotating the substrate by every 360/n degrees.

Supposing that the target dose amounts in the central region and the peripheral region are $D_A$ and $D_B$, respectively, and the set dose amounts at the first scanning speed and the second scanning speed in one implantation process are $d_1$ and $d_2$, respectively, the set dose amounts $d_1$ and $d_2$ may be set in accordance with the formula, $$d_1 = (2D_B - D_A)/n \text{ and}$$

$$d_2 = D_A/n$$

The dose distribution having different dose amounts between the central region and the peripheral region around the central region may be formed within the plane of the substrate by performing an implantation process, n (n is an integer of 2 or greater) times, of implanting ions into the substrate by changing stepwise the driving speed of the substrate from a first driving speed to a second driving speed different from the first driving speed to the first driving speed within an area where the ion beam is incident on the substrate, and a rotation process of rotating the substrate by every 360/n degrees.

Supposing that the target dose amounts in the central region and the peripheral region are $D_A$ and $D_B$, respectively, and the set dose amounts at the first driving speed and the second driving speed in one implantation process are $d_1$ and $d_2$, respectively, the set dose amounts $d_1$ and $d_2$ may be set in accordance with the formula, $$d_1 = (2D_B - D_A)/n \text{ and}$$

$$d_2 = D_A/n$$

[Operation of the Invention]

With the above-mentioned ion implantation method and apparatus, at least one of the scanning speed of the ion beam and the driving speed of the substrate is changed within the area where the ion beam is incident on the substrate, whereby the central part of the substrate may not be necessarily made the boundary of changing the dose amount. Accordingly, various dose distributions are formed within the plane of the substrate. Consequently, it is possible to make the ion implantation to adaptively correct or change the characteristics of the semiconductor device in a specific area of the semiconductor device formed within the plane of the substrate.

Further, since the substrate is rotated around the central part, the dose distribution may be changed in the rotational direction around the central part of the substrate, whereby various dose distributions can be formed within the plane of the substrate.

Moreover, the implantation process of implanting ions into the substrate by changing stepwise at least one of the scanning speed of the ion beam and the driving speed of the substrate is performed multiple time, and a rotation process of rotating the substrate around the central part of the substrate by every 360/n degrees in an interval between each implantation process is performed, whereby the dose distribution in rotation symmetry around the central part of the substrate is formed. Consequently, various dose distributions are further formed within the plane of the substrate.

Further, the implantation process of implanting ions into the substrate by changing stepwise the scanning speed of the ion beam from a first scanning speed to a second scanning speed different from the first scanning speed to the first scanning speed, and the rotation process of rotating the substrate stepwise are performed, whereby it is possible to form the dose distributions having different dose amounts in the central region of the substrate and the peripheral region around the central region.

Moreover, the set dose amounts $d_1$ and $d_2$ are set in accordance with the given formula, whereby the target dose amounts $D_A$ and $D_B$ in the central region and the peripheral region are easily attained.

Further, the implantation process of implanting ions into the substrate by changing stepwise the driving speed of the substrate from a first driving speed to a second driving speed different from the first driving speed to the first driving speed, and the rotation process of rotating the substrate stepwise are performed, whereby it is possible to form the dose distributions having different dose amounts in the central region of the substrate and the peripheral region around the central region.

DETAILED DESCRIPTION OF THE INVENTION

Figure 1:
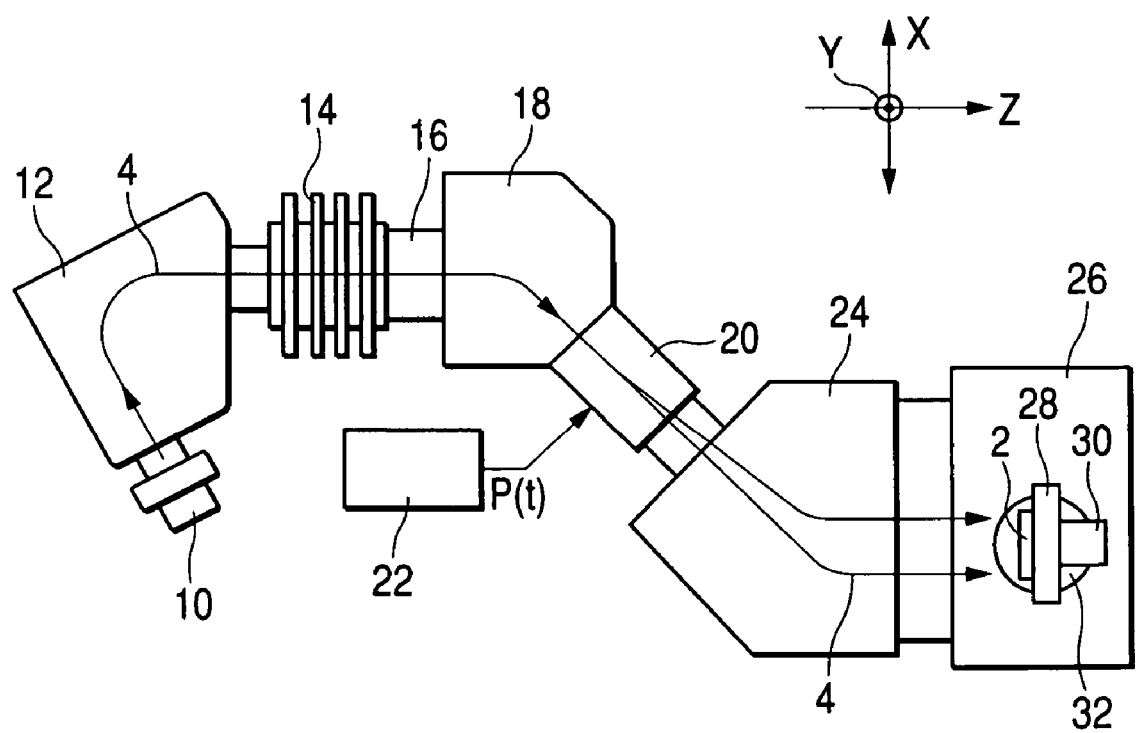
FIG. 1 is a schematic plan view showing one example of an ion implantation apparatus for performing anion implantation method according to this invention.
Figure 2:
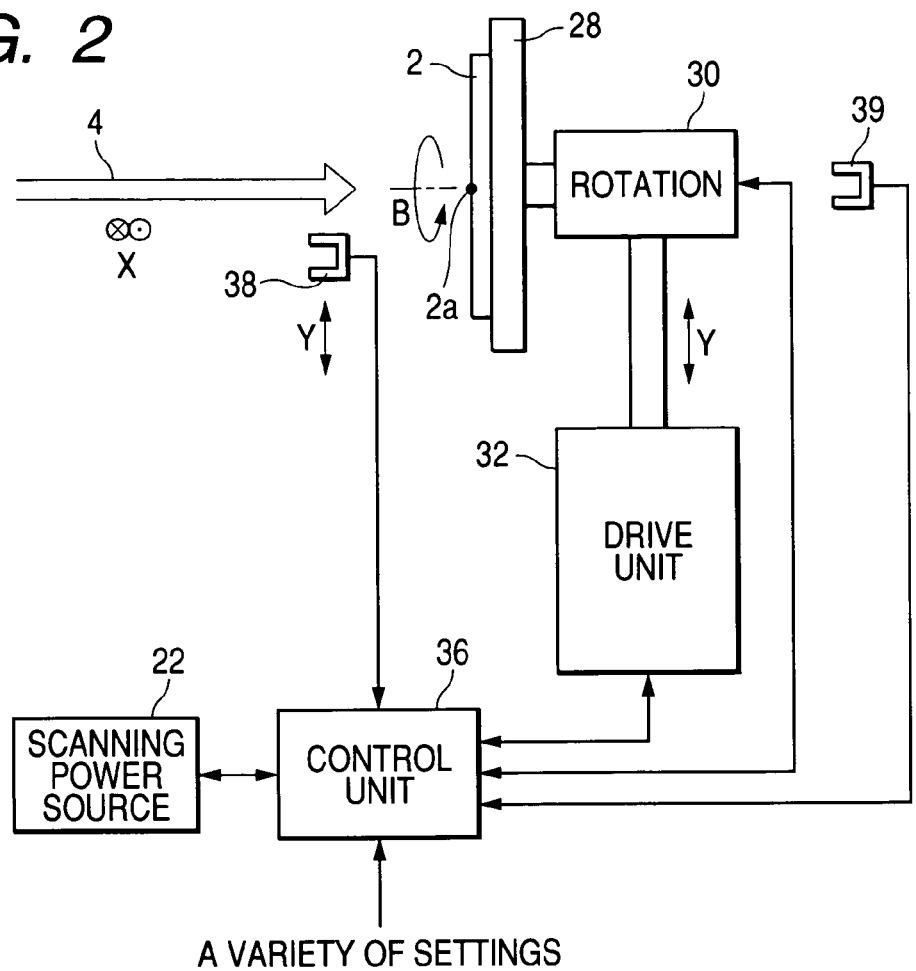
FIG. 2 is a schematic side view, in larger scale, showing one example of the ion implantation apparatus of FIG. 1.

FIG. 1 is a schematic plan view showing one example of an ion implantation apparatus for performing an ion implantation method according to this invention. FIG. 2 is a schematic side view, in larger scale, showing one example of a substrate and its surroundings of the ion implantation apparatus of FIG. 1.

This ion implantation apparatus relies on a so-called hybrid scan method of implanting ions over the entire surface of the substrate (e.g., semiconductor substrate) 2, employing the reciprocating scanning of an ion beam 4 in the X direction (e.g., horizontal direction) by an electric field or magnetic field and the mechanical reciprocating driving of the substrate 2 in the Y direction (e.g., vertical direction) almost orthogonal to the X direction. The ion implanter of hybrid scan system was also described in JP-A-2001-143651 and JP-A-2001-185071.

This ion implanter specifically comprises an ion species 10 for extracting the ion beam 4, a mass separating magnet 12 for selectively deriving a specific ion species from the ion beam 4 extracted from the ion source 10, an accelerating tube 14 for accelerating or decelerating the ion beam 4 derived from this mass separation magnet 12, a Q lens 16 for shaping the ion beam 4 derived from the accelerating tube 14, an energy separator 18 for selectively deriving ions of specific energy from the ion beam 4 derived from the Q lens 16, a scanner 20 for scanning reciprocatingly the ion beam 4 derived from the energy separator 18 in the X direction by electric field or magnetic field, and a beam parallelizer 24 for making parallel the ion beam 4 for scanning in cooperation with the scanner 20 by bending back the ion beam 4 derived from the scanner 20 by electric field or magnetic field, namely, producing the parallel ion beam 4.

The ion beam 4 derived from the beam parallelizer 24 is applied on the substrate 2 held on a holder 28 within an implant chamber 26 to make ion implantation into the substrate 2. Then, the substrate 2 is driven reciprocatingly in the Y direction by a drive unit 32. The reciprocating driving of the substrate 2 and the reciprocating scanning of the ion beam 4 cooperate to make ion implantation over the entire surface of the substrate 2.

In this case, the driving speed v of the substrate 2 in the Y direction is controlled to be inversely proportional to beam current density J of the ion beam 4 within an area where the ion beam is incident on the substrate 2, as described in the above-mentioned JP-A-2003-132835. In other words, it is controlled so that J/v may be constant. In this way, even if the beam current density J of the ion beam 4 is changed during ion implantation into the substrate 2, this change is compensated by the driving speed v to prevent a change in the dose amount into the substrate 2 from occurring. That is, the ion implantation is made at a predetermined dose amount into the substrate 2.

Further, this ion implanter comprises a rotation unit 30 for rotating the substrate 2 together with the holder 26 around a central part 2a of the substrate 2 (e.g., in the clockwise direction as indicated by the arrow B in FIG. 2). The drive unit 32 drives reciprocatingly the rotation unit 30, the holder 28 and the substrate 2 as a whole in the Y direction.

The scanning of the ion beam 4 is controlled based on a scan output (e.g., scan voltage or scan current) P(t) supplied from a scanning power source 22 to the scanner 20. P(t) is a function of time t. This scanning power source 22 and the scanner 20 constitute a scan unit for scanning the ion beam 4 reciprocatingly in the X direction.

A former stage multi-point Faraday system 38 and a latter stage multi-point Faraday system 39 used to shape the waveform of the scan output P(t) by receiving the ion beam 4 and measuring the beam current density distribution in the X direction are arranged upstream and downstream of the holder 28, as shown in FIG. 2. The former stage multi-point Faraday system 38 and the latter stage multi-point Faraday system 39 consist of a plurality of Faraday cups arranged in the X direction. The latter stage multi-point Faraday system 39 is fixed on a beam line of the ion beam 4. The former stage multi-point Faraday system 38 and the holder 28 are driven in the Y direction, and placed on the beam line of the ion beam 4, when needed. A similar multi-point Faraday system was described in JP-A-2001-143651.

The measured values by the multi-point Faraday systems 38 and 39 are outputted to the control unit 36. The control unit 36 has the functions of (1) controlling the scan unit (specifically the scanning power source 22 and so forth in this embodiment) to adjust the scanning speed s of the ion beam 4 in the X direction, (2) controlling the drive unit 32 to adjust the driving speed v of the substrate 2 on the holder 8 in the Y direction, (3) controlling the rotation unit 30 to rotate the substrate 2 around the central part 2a, and (4) controlling the scan unit, the drive unit 32 and the rotation unit 30 to perform an implantation process and an intermediate rotation process multiple times, and (5) shaping the waveform of the scan output P(t) in this embodiment, based on the measured values and various kinds of set values.

An example of the ion implantation method for forming various dose distributions within the plane of substrate in this ion implanter will be described below.

For example, a dose distribution that is non-uniform within the plane of the substrate 2 is formed by changing the scanning speed s of the ion beam 4 in the X direction according to a predetermined pattern, while controlling the driving speed v of the substrate 2 in the Y direction to be inversely proportional to the beam current density of the ion beam 4. The driving speed v of the substrate 2 is controlled to be inversely proportional to the beam current density to compensate for a possible variation in the beam current density of the ion beam 4. If there is no variation in the beam current density of the ion beam 4, the driving speed v of the substrate 2 is constant. In the following description, the driving speed v of the substrate 2 and the scanning speed s of the ion beam 4 means the driving speed and the scanning speed within an area where the ion beam 4 is incident on the substrate 2 because the scanning and driving speeds s and v have no influence on the dose amount into the substrate 2 outside this region.

In this case, several examples of the position and extent of changing the scanning speed s of the ion beam 4, namely, the pattern of changing the scanning speeds, are shown in FIGS. 3 to 7.

Figure 3:
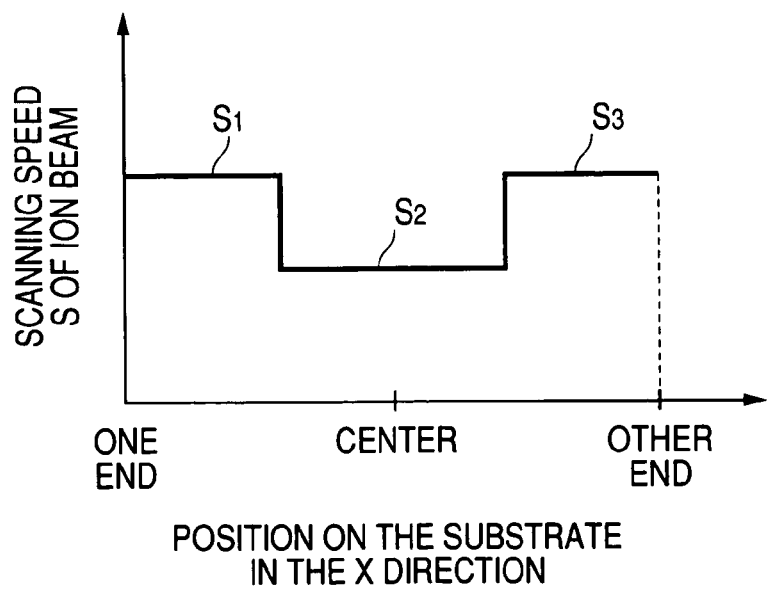
FIG. 3 is a view showing a pattern example for changing the scanning speed of ion beam.

In an example of FIG. 3, the scanning speed s of the ion beam 4 is changed in a stepwise form of concave from $s_1$ to $s_2$ to $s_3$ (=$s_1$). In this example, $s_2$ is smaller than $s_1$, but conversely, $s_2$ may be larger than $s_1$ to change the scanning speed in convex form. Also, $s_1$ may not be equal to $s_3$. Also, the scanning speed may be changed at more steps. Since actually the scanning speed s can not be changed at time 0 even if the change is stepwise, there is a slight transition interval associated therewith (the same shall apply hereinafter).

The dose amount into the substrate 2 is inversely proportional to the scanning speed s of the ion beam 4, if the beam current density of the ion beam 4 is constant. That is, the scanning speed s and the dose amount are in inverse relation, in which the dose amount is smaller in a region of higher scanning speed s, and the dose amount is larger in a region of lower scanning speed s. Since the scanning speed s of the ion beam 4 is much higher than the driving speed v of the substrate 2, it is reasonably considered that the beam current density of the ion beam 4 is constant while scanning the ion beam 4 in the X direction on the substrate 2 at one time.

Figure 9:
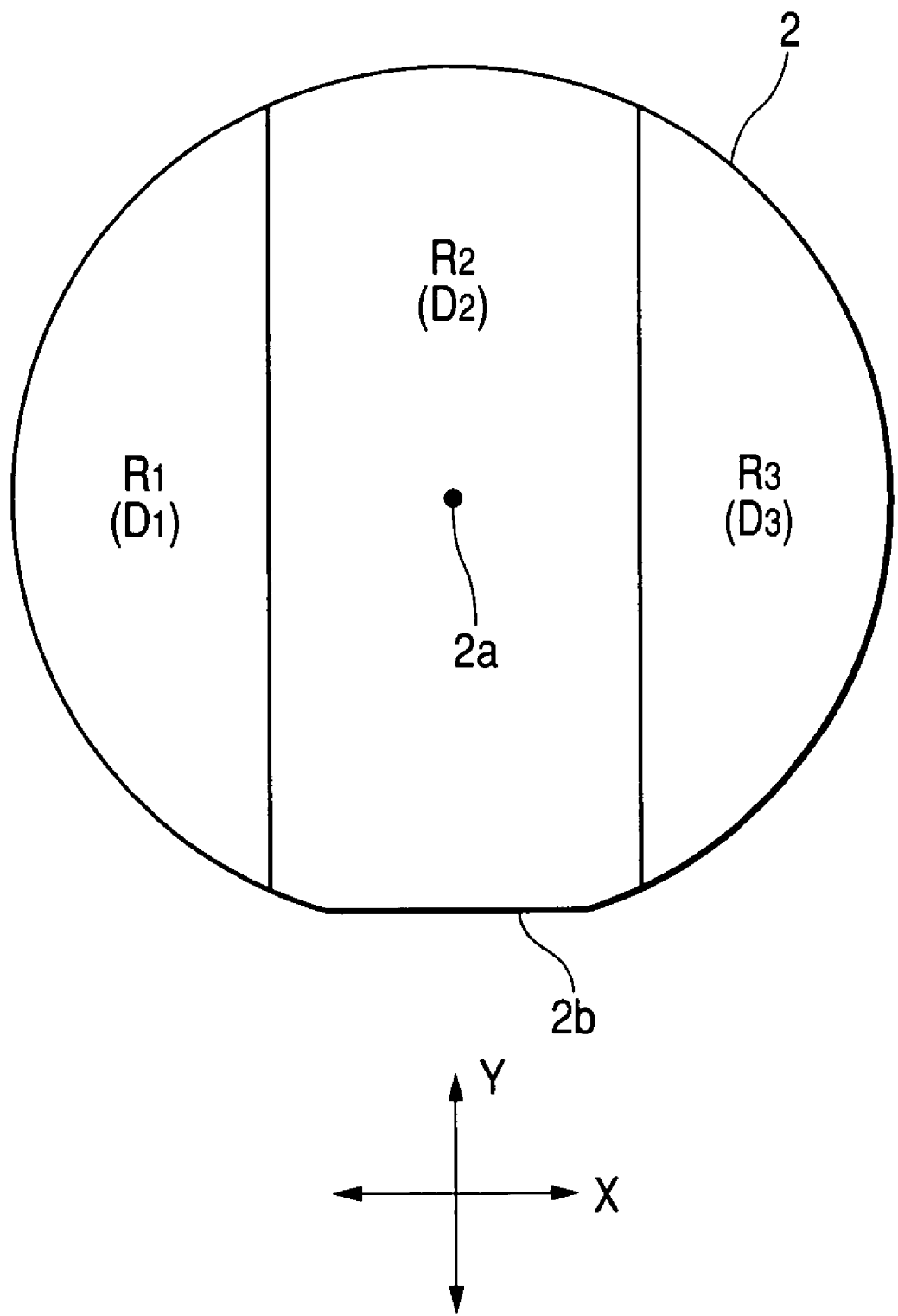
FIG. 9 is a view for theoretically explaining how to form the dose distribution having different doses between a central region of substrate and a peripheral region around it.

Accordingly, in the example of FIG. 3, the regions $R_1$ to $R_3$ having different dose amounts are formed like a river along the Y direction within the plane of the substrate 2, as in an example shown in FIG. 9 (because the driving speed v of the substrate 2 is controlled as above to suppress a change in the dose amount in the Y direction). The correlation between the dose amounts in the regions $R_1$ to $R_3$ is identical to that as described above.

An orientation flat 2b of the substrate 2 as shown in FIGS. 9 to 14 is illustrated to make clear the positional relation in rotating the substrate 2 as will be described later, and the positional relation between the orientation flat 2b and the implantation area is not specifically limited.

Figure 4:
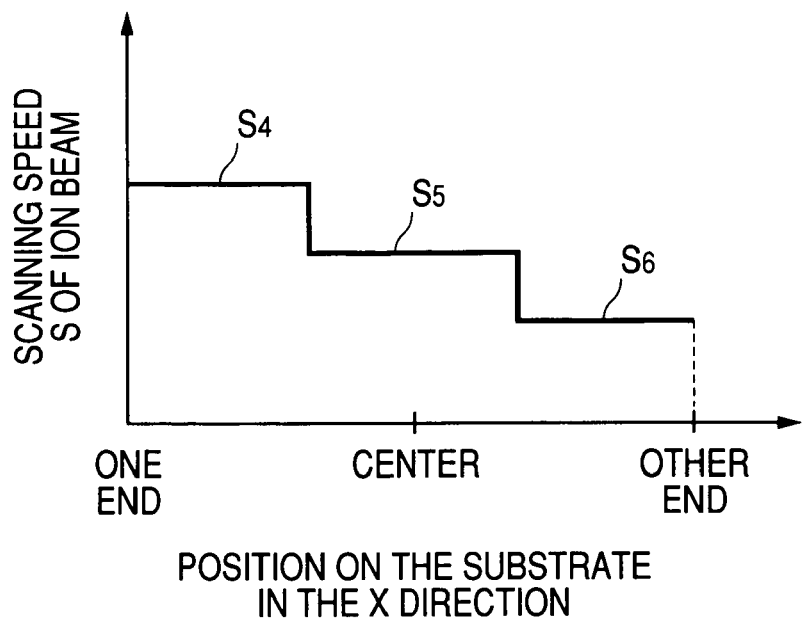
FIG. 4 is a view showing a pattern example for changing the scanning speed of ion beam.

In an example of FIG. 4, the scanning speed s of the ion beam 4 is changed in another stepwise form from s4 to s5 to s6 (=s4>s5>s6). On the contrary, the scanning speed may be changed in s4<s5<s6. Also, the scanning speed may be changed in more steps.

In the example of FIG. 4, the regions $R_1$ to $R_3$ having different dose amounts are formed like a river along the Y direction within the plane of the substrate 2, as in the example as shown in FIG. 9. However, the correlation between the dose amounts in the regions $R_1$ to $R_3$ is different from the example of FIG. 3.

Figure 5:
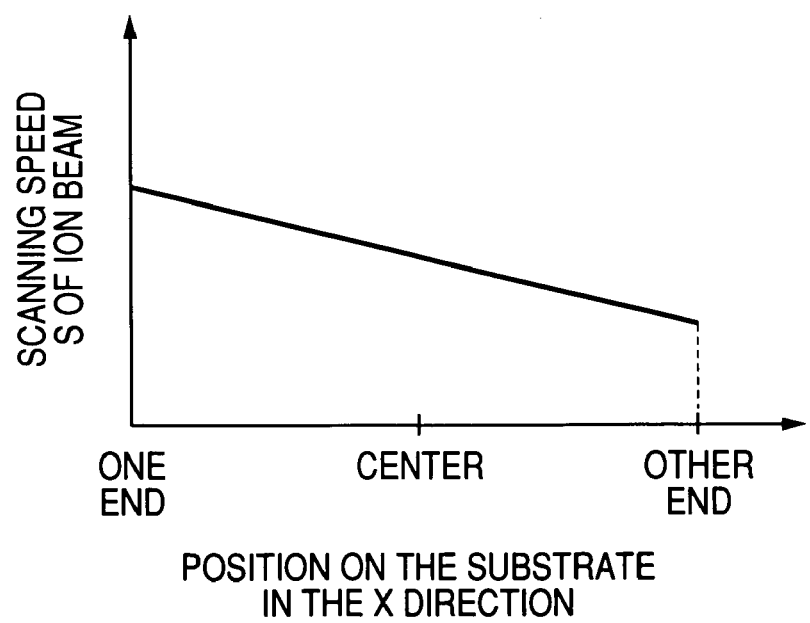
FIG. 5 is a view showing a pattern example for changing the scanning speed of ion beam.

In an example of FIG. 5, the scanning speed s of the ion beam 4 is changed linearly as one form of continuously and smoothly changing it. The inclination may be oppositely made to that as illustrated. Also, the inclination may be larger or smaller.

In the example of FIG. 5, the dose distribution in which the dose amount is continuously changed at an inclination opposite to that of FIG. 5 is formed within the plane of the substrate 2.

Figure 6:
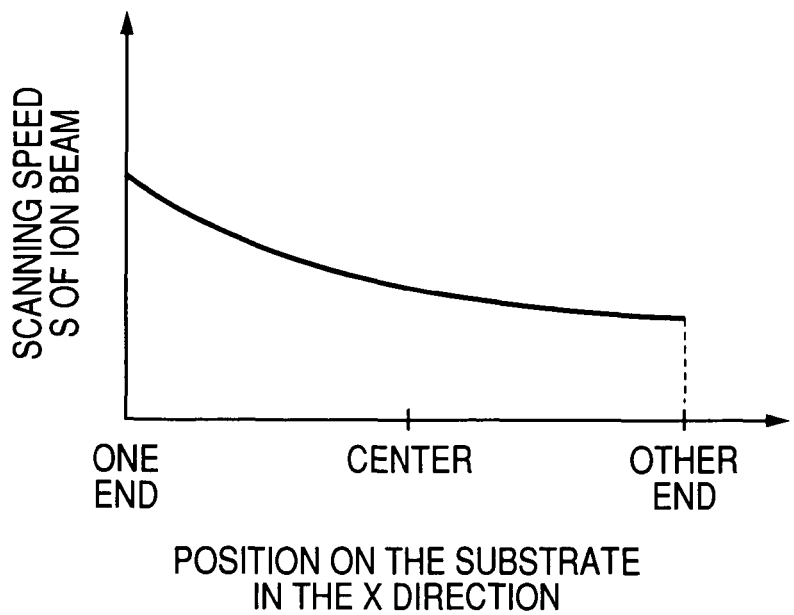
FIG. 6 is a view showing a pattern example for changing the scanning speed of ion beam.

In an example of FIG. 6, the scanning speed s of the ion beam 4 is changed like a curve as another form of continuously and smoothly changing it. Though in the example of FIG. 6, the curve is like a valley, the curve may be like a mountain.

In the example of FIG. 6, the dose distribution in which the dose amount is continuously changed at an inclination opposite to that of FIG. 6 is formed within the plane of the substrate 2.

Figure 7:
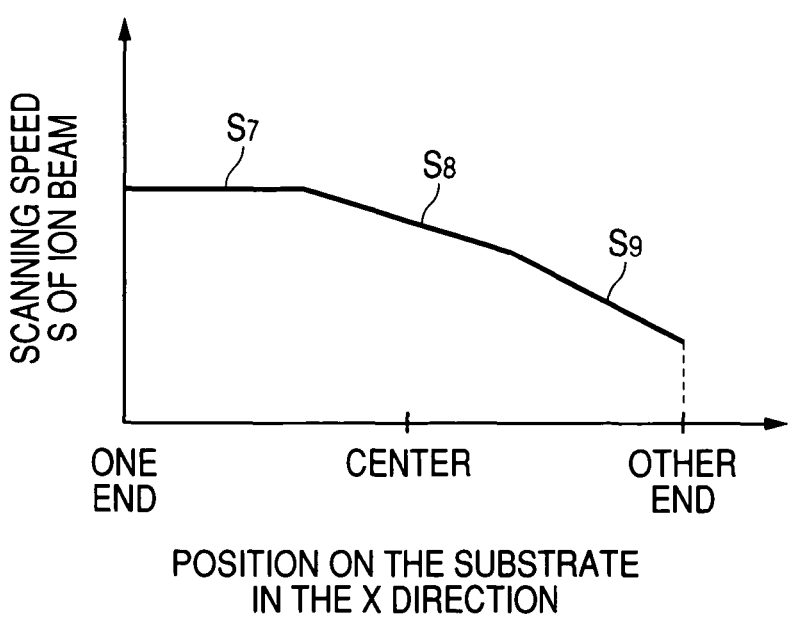
FIG. 7 is a view showing a pattern example for changing the scanning speed of ion beam.

In an example of FIG. 7, the scanning speed s of the ion beam 4 is changed like buckling at three steps s7, s8 and s9. The inclination may be opposite to that as illustrated. The scanning speed may be changed at more steps.

In the example of FIG. 7, the regions. $R_1$ to $R_3$ having different dose amounts are formed like a river along the Y direction within the plane of the substrate 2, as in the example as shown in FIG. 9. The correlation of dose amounts in the regions $R_1$ to $R_3$ is different from that as shown in FIGS. 3 and 4.

The control unit 36 controls the scan unit to change the scanning speed s of the ion beam in the way as described above.

In the above examples, the dose distribution that is non-uniform within the plane of the substrate 2 is formed by changing the scanning speeds of the ion beam 4 in the X direction, while controlling the driving speed v of the substrate 2 in the Y direction to be inversely proportional to the beam current density of the ion beam 4. And the pattern for changing the scanning speed s may be adequately selected to form various dose distributions within the plane of the substrate 2. It is not always necessary to have the central part 2a of the substrate 2 as the boundary where the dose amount is changed. Accordingly, it is possible to make the ion implantation to adaptively correct or change the characteristics of the semiconductor device in a specific area of the semiconductor device formed within the plane of the substrate 2, for example.

The dose amount into the substrate 2 is also inversely proportional to the driving speed v of the substrate 2, if the beam current density of the ion beam 4 is constant. Accordingly, the dose distribution that is non-uniform within the plane of the substrate 2 may be formed by changing the driving speed v of the substrate 2 in the Y direction according to a predetermined pattern while keeping constant the scanning speed s of the ion beam 4 in the X direction.

In this case, several examples of the position and extent of changing the driving speed v of the substrate 2, namely, the pattern of changing the driving speed v, are obtained when the longitudinal axis is the driving speed v of the substrate 2, and the transverse axis is the position on the substrate in the Y direction in FIGS. 3 to 7. The above description is applicable to this case.

The control unit 36 controls the drive unit 32 to change the driving speed v of the substrate 2 as described above.

In this way, the dose distribution that is non-uniform within the plane of the substrate 2 may be formed by changing the driving speed v of the substrate 2 in the Y direction according to a predetermined pattern while keeping constant the scanning speed s of the ion beam 4 in the X direction. And various dose distributions may be formed within the plane of the substrate 2 by appropriately selecting the pattern for changing the driving speed v. It is not always necessary to have the central part 2a of the substrate 2 as the boundary where the dose amount is changed. Accordingly, it is possible to make the ion implantation to adaptively correct or change the characteristics of the semiconductor device in a specific area of the semiconductor device formed within the plane of the substrate 2, for example.

The dose distribution that is non-uniform within the plane of the substrate 2 may be formed by changing the scanning speed s of the ion beam 4 as in the above examples and changing the driving speed v of the substrate 2 as in the above examples at the same time. Since the dose distribution is changed in the X and Y directions within the plane of the substrate 2 in this way, various dose distributions are further formed within the plane of the substrate 2.

The control unit 36 may control the scan unit and the drive unit 32 to change the scanning speed v of the ion beam 4 and the driving speed v of the substrate 2 in the above way.

Moreover, the non-uniform dose distribution may be formed within the plane of the substrate 2 by changing at least one of the scanning speed S of the ion beam 4 and the driving speed v of the substrate 2 and rotating the substrate 2 around the central part 2a.

In this way, since the dose distribution is changed in the rotational direction around the central part 2a of the substrate 2, various dose distributions may be further formed within the plane of the substrate.

In rotating the substrate 2, the substrate may be rotated stepwise by every predetermined rotation angle θ, or rotated continuously smoothly within a predetermined rotation angle θ. In the former case, the dose distribution within the plane of the substrate 2 has a clear boundary. The rotation angle θ is any value within a range $0 < \theta \leq 360°$.

Also, the substrate 2 may be rotated while the ion beam 4 is not applied to the substrate 2, or while the ion beam 4 is applied to the substrate 2. In the former case, the dose distribution within the plane of the substrate 2 has a clear boundary.

The control unit 36 controls the rotation unit 30 to rotate the substrate 2 in the above way.

Figure 8:
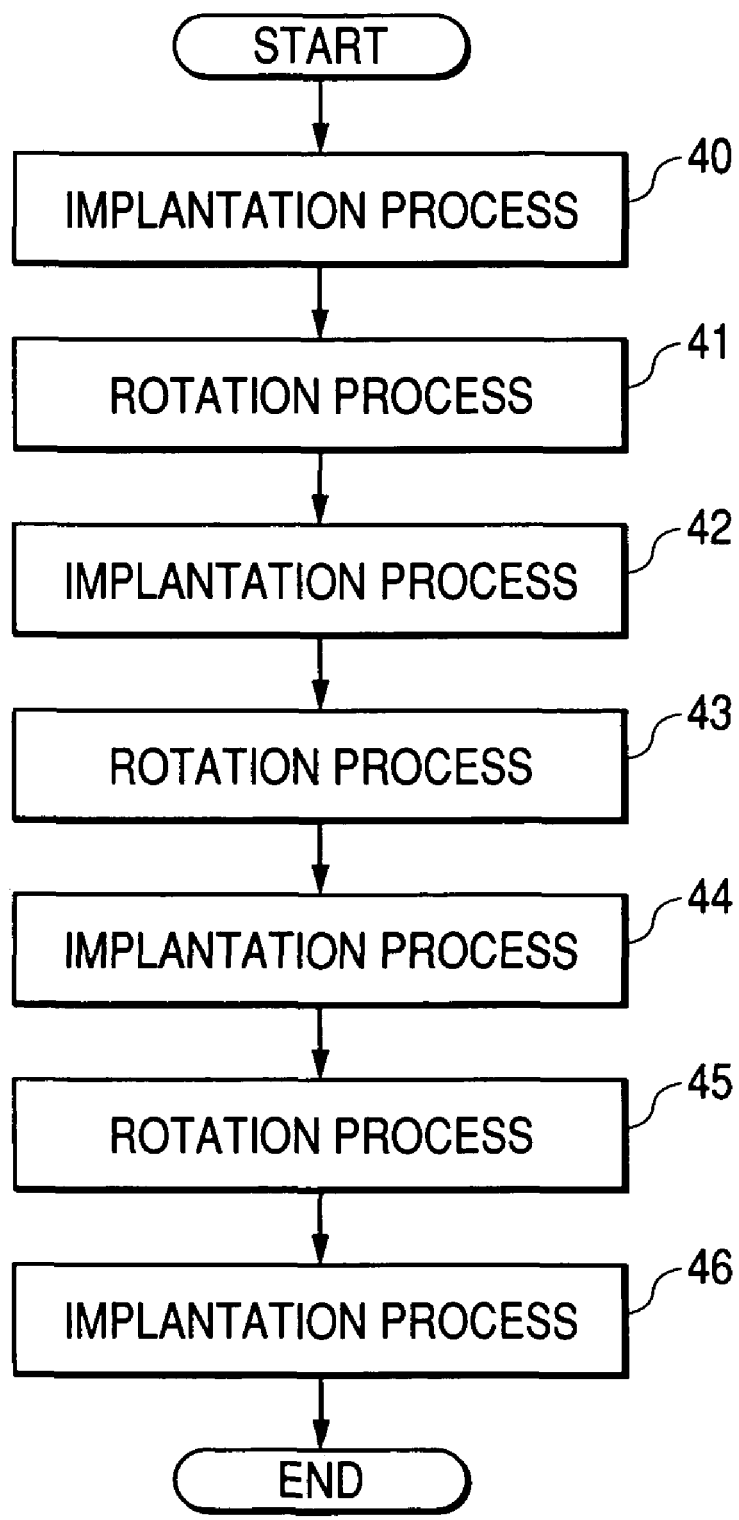
FIG. 8 is a process diagram showing one example of the ion implantation method according to this invention.

Also, the dose distribution that is non-uniform within the plane of the substrate 2 may be formed by performing an implantation process of implanting ions into the substrate 2 by changing the scanning speed s of the ion beam 4 stepwise, while controlling the driving speed v of the substrate 2 to be inversely proportional to the beam current density of the ion beam 4, like a process example as shown in FIG. 8, multiple times, and a rotation process of rotating the substrate 2 around the central part 2a by a predetermined rotation angle in an interval between each implantation process while the ion beam 4 is not applied to the substrate 2. In the example of FIG. 8, the implantation process is formed four times (i.e., implantation process 40, 42, 44 and 46), and, the rotation process is performed once in the interval between each implantation process, or three time in total (i.e., rotation process 41, 43 and 45).

In this way, since the implantation process of implanting ions by changing the scanning speed s of the ion beam 4 stepwise and the rotation process of rotating the substrate 2 around the central part 2a in the interval between each implantation process are performed multiple times, the dose distribution in rotation symmetry around the central part 2a of the substrate 2 is formed. Thereby, various dose distributions are further formed within the plane of the substrate 2.

The control unit 36 controls the scan unit, the drive unit 32 and the rotation unit 30 to perform the implantation process and the rotation process in the above way.

The dose distribution having different dose amounts between the central area and its peripheral area within the plane of the substrate 2 may be formed by performing the implantation process of changing the scanning speed s of the ion beam 4 stepwise from $s_1$ to $s_2$ ($\neq s_1$) to $s_3$ ($=S_1$) from one end to the other as shown in FIG. 3 n times (n is an integer of two or greater), and the rotation process of rotating the substrate 2 by every 360/n degrees. The control unit 36 can perform this control.

Referring to FIGS. 9 to 12, the dose distribution formed within the plane of the substrate 2 will be described in succession when the implantation process of changing the scanning speed s of the ion beam 4 stepwise from $s_1$ to $s_2$ ($\neq s_1$) to $s_3$ ($=s_1$) as shown in FIG. 3 is performed four times (n=4) The dose amount distribution formed within the plane of the substrate 2 in the case of the process shown in FIG. 8 will be explained with FIGS. 9-12 as follows. The position of the substrate 2 in the rotation direction is easily seen by referring to the orientation flat 2b, as previously described. The scanning speed s of the ion beam 4 is actually changed with a slight transition interval, and the cross sectional dimension (spot size) of the ion beam 4 before scanning has a predetermined size in reality. However, for simpler explanation in the following, it is supposed that the scanning speed s of the ion beam 4 is changed without transition interval, and the cross section dimensions of the ion beam 4 are spot-like.

First of all, the first implantation process 40 is performed, whereby the regions $R_1$ to $R_3$ having different dose amounts are formed like a river along the Y direction within the plane of the substrate 2, as shown in FIG. 9. At this time, supposing that the set dose amount for implantation in the implantation process is $d_1$ in the area where the scanning speed is $s_1$ ($=s_3$), and $d_2$ in the area where the scanning speed is $s_2$, the dose amounts $D_1$, $D_2$ and $D_3$ implanted into the areas $R_1$, $R_2$ and $R_3$ within the plane of the substrate 2 in the above process are given by the following formula.

$D_1=d_1$ $D_2=d_2$ $D_3=d_1$ [Formula 1]

Figure 10:
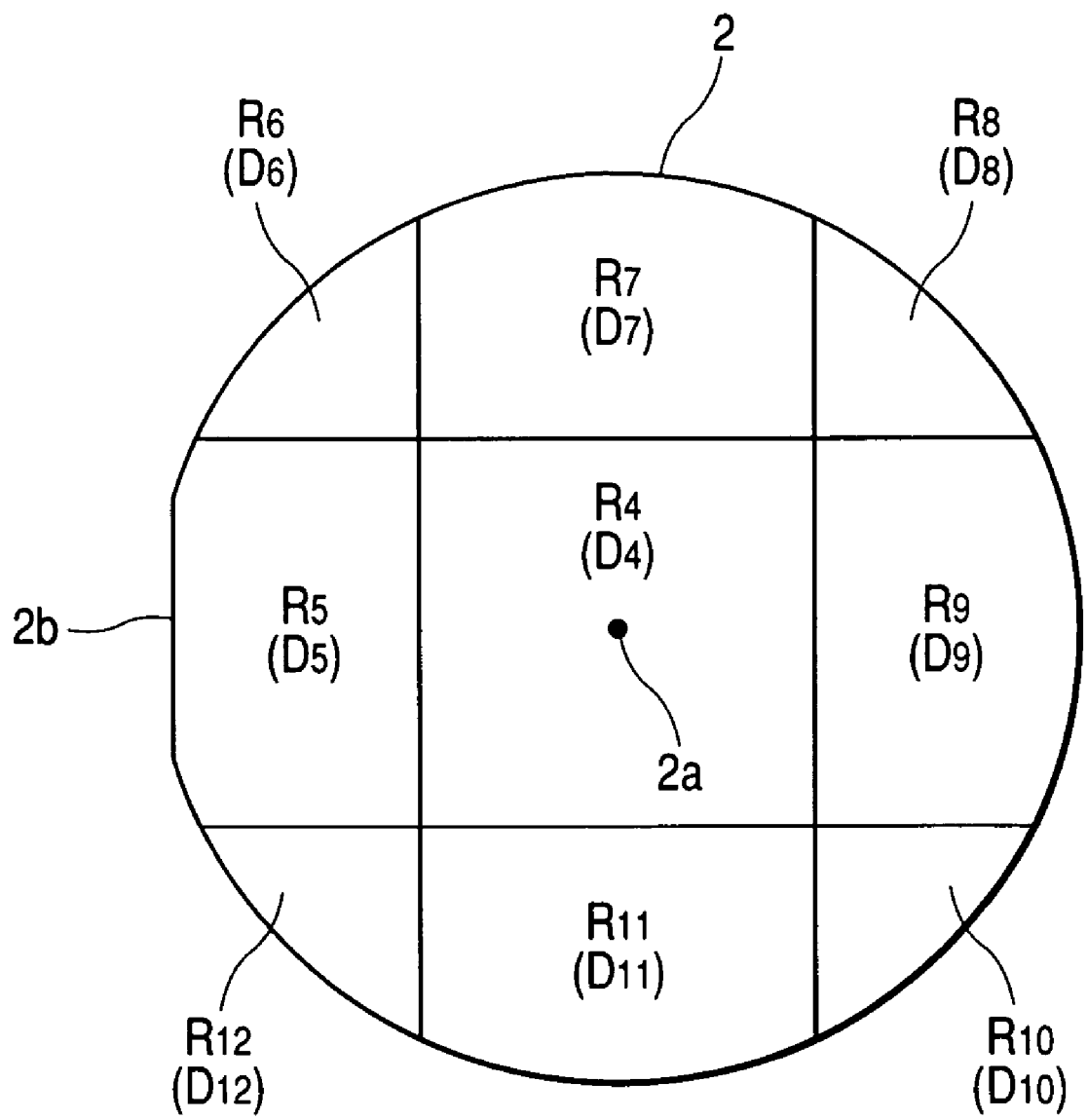
FIG. 10 is a view for theoretically explaining how to form the dose distribution having different doses between the central region of substrate and the peripheral region around it.
Figure 10:
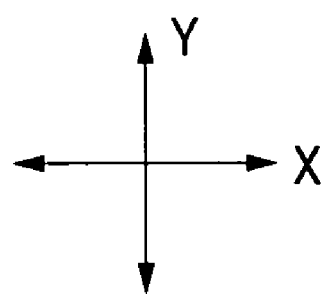

Then, after the first rotation process 41 is performed, the second implantation process 42 is performed, whereby the regions $R_4$ to $R_{12}$ having different dose amounts are formed like a lattice within the plane of the substrate 2, as shown in FIG. 10. This corresponds to superimposition of the dose distribution of FIG. 9 and the dose distribution of FIG. 9 rotated by 90 degrees. The dose amounts $D_4$ to $D_{12}$ implanted into the regions $R_4$ to $R_{12}$ through the above processes are given by the following formula 2.

$D_4=2d_2$ $D_5=d_1+d_2$ $D_6=2d_1$ $D_7=d_1+d_2$ $D_8=2d_1$ $D_9=d_1+d_2$ $D_{10}=2d_1$ $D_{11}=d_1+d_2$ $D_{12}=2d_1$ [Formula 2]

Figure 11:
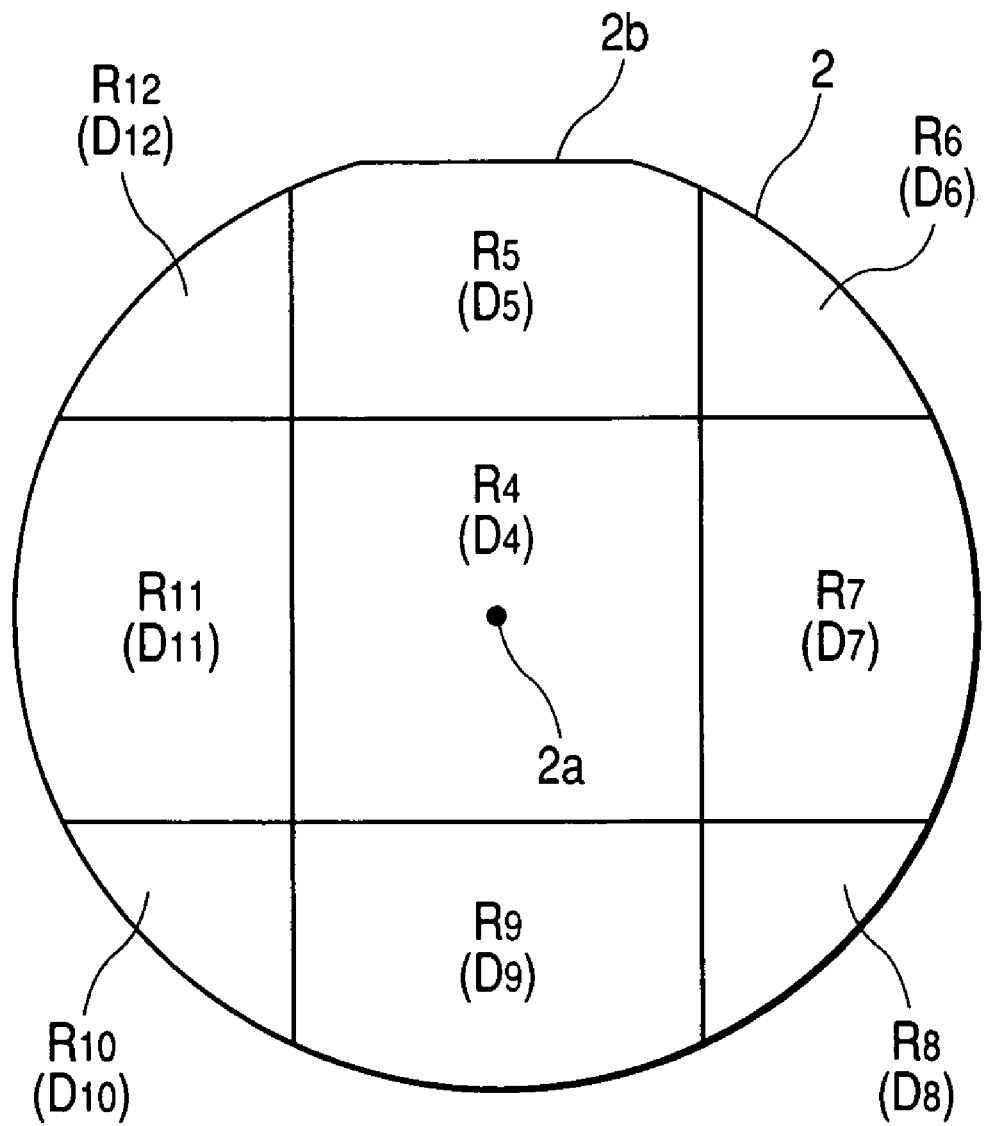
FIG. 11 is a view for theoretically explaining how to form the dose distribution having different doses between a central region of substrate and a peripheral region around it.
Figure 11:
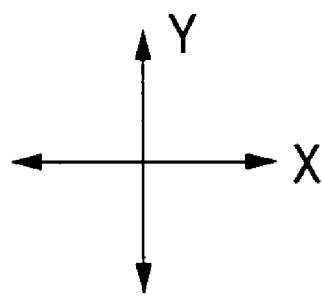

In the following, after the second rotation process 43 is performed, the third implantation process 44 is performed in the same way, whereby in the state as shown in FIG. 11, the dose amounts $D_4$ to $D_{12}$ implanted into the regions $R_4$ to $R_{12}$ through the above processes are given by the following formula 3.

$D_4=3d_2$ $D_5=d_1+2d_2$ $D_6=3d_1$ $D_7=2d_1+d_2$ $D_8=3d_1$ $D_9=d_1+2d_2$ $D_{10}=3d_1$ $D_{11}=2d_1+d_2$ $D_{12}=3d_1$ [Formula 3]

Moreover, after the third rotation process 45 is performed, the fourth implantation process 46 is performed, whereby the ion implantation process is completed. As a result, in the state as shown in FIG. 12, the dose amounts $D_4$ to $D_{12}$ implanted into the regions $R_4$ to $R_{12}$ through the above processes are given by the following formula 4.

$D_4=4d_2$ $D_5=2d_1+2d_2$ $D_6=4d_1$ $D_7=2d_1+2d_2$ $D_8=4d_1$ $D_9=2d_1+2d_2$ $D_{10}=4d_1$ $D_{11}=2d_1+2d_2$ $D_{12}=4d_1$ [Formula 4]

Figure 12:
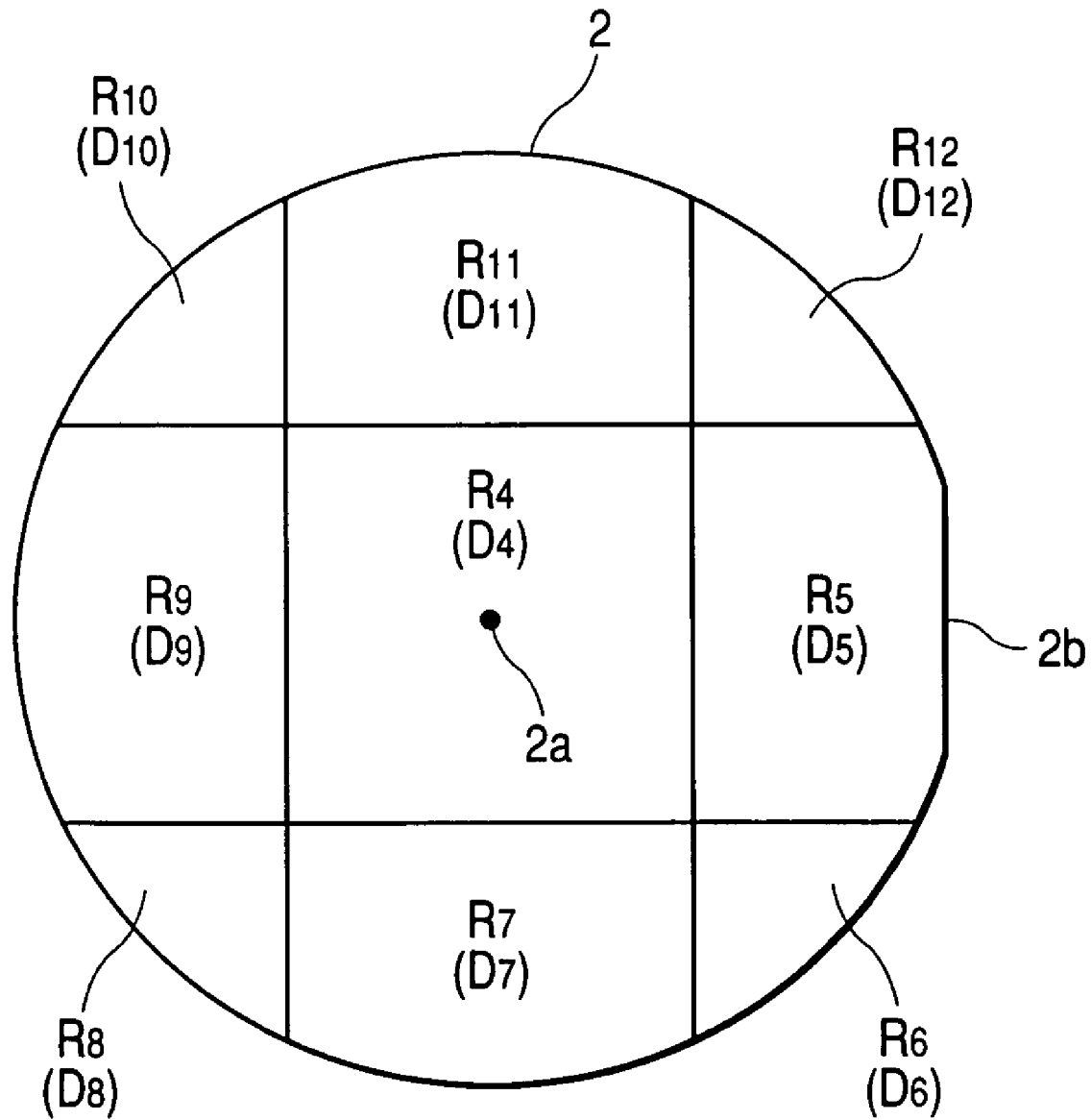
FIG. 12 is a view for theoretically explaining how to form the dose distribution having different doses between the central region of substrate and the peripheral region around it.
Figure 12:
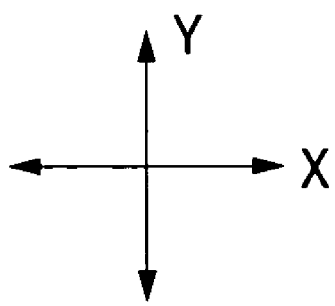

As will be seen from FIG. 12 and formula 4, the dose distribution having different dose amounts between the central region $R_4$ and its peripheral regions $R_5$ to $R_{12}$ is formed by ion implantation as described above.

Herein, the actual ion implantation method (apparatus) will be described. The scanning speed s of the ion beam 4 is changed with as light transition interval and the cross-sectional dimension (spot size) of the ion beam 4 has a predetermined size (e.g., circular shape having a diameter of about 70 to 80 mmm), as previously described. As a result, the dose amount is gently changed near the boundary of each region $R_4$ to $R_{12}$. Accordingly, the central region $R_4$ is nearly circular, and the regions $R_6$, $R_8$, $R_{10}$ and $R_{12}$ at four corners are very small, so that the dose distribution consists of the central region $R_4$ that is nearly circular and has the dose amount $3d_2$ and the peripheral region that is annular and has the dose amount $2d_1+2d_2$. As described above, from the point of view of changing the dose amount gently (smoothly), the cross sectional dimension of the ion beam 4 is preferably large to some extent.

Figure 13:
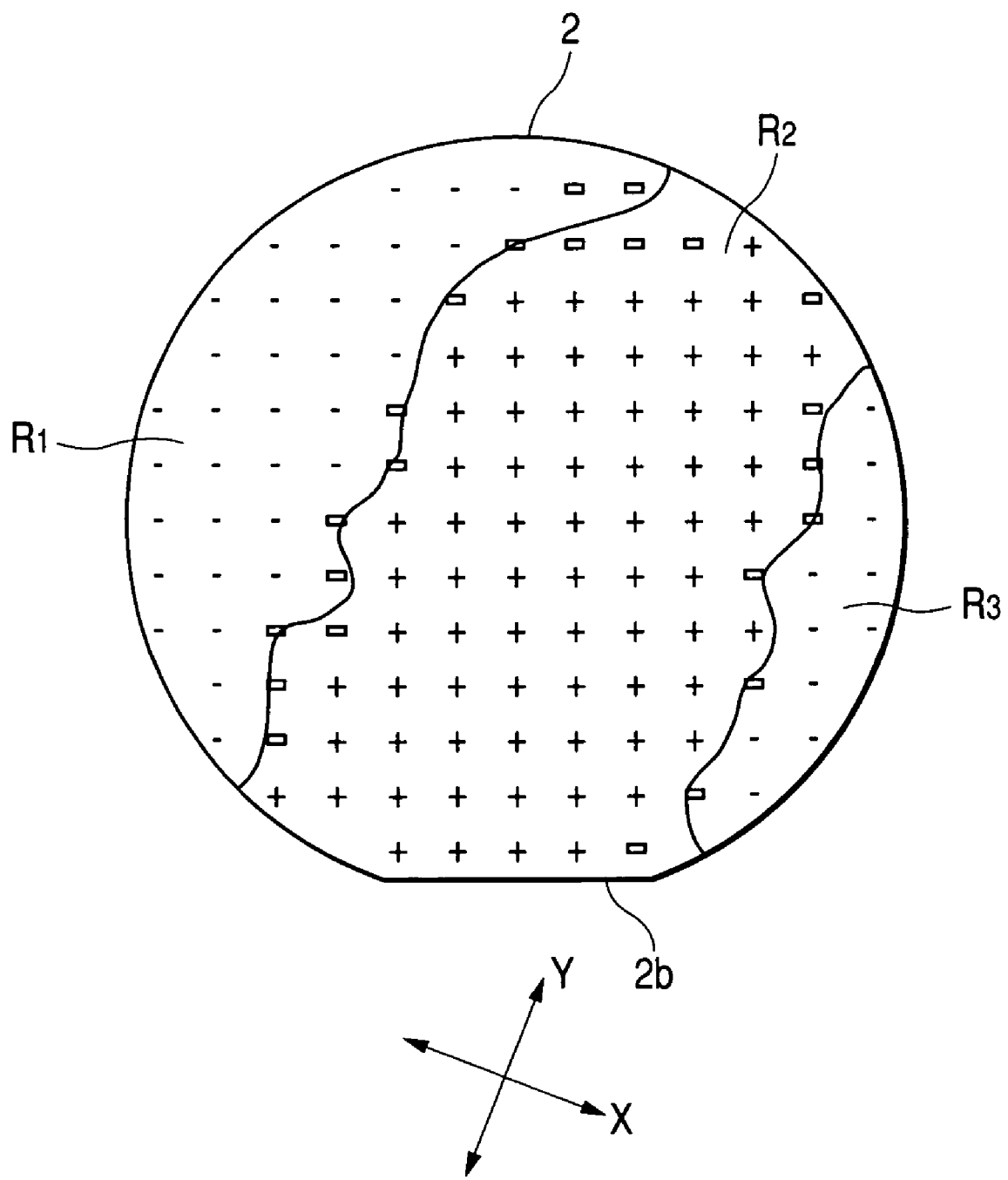
FIG. 13 is a view showing one example of the dose distribution actually obtained after the first implantation process, corresponding to FIG. 9.
Figure 14:
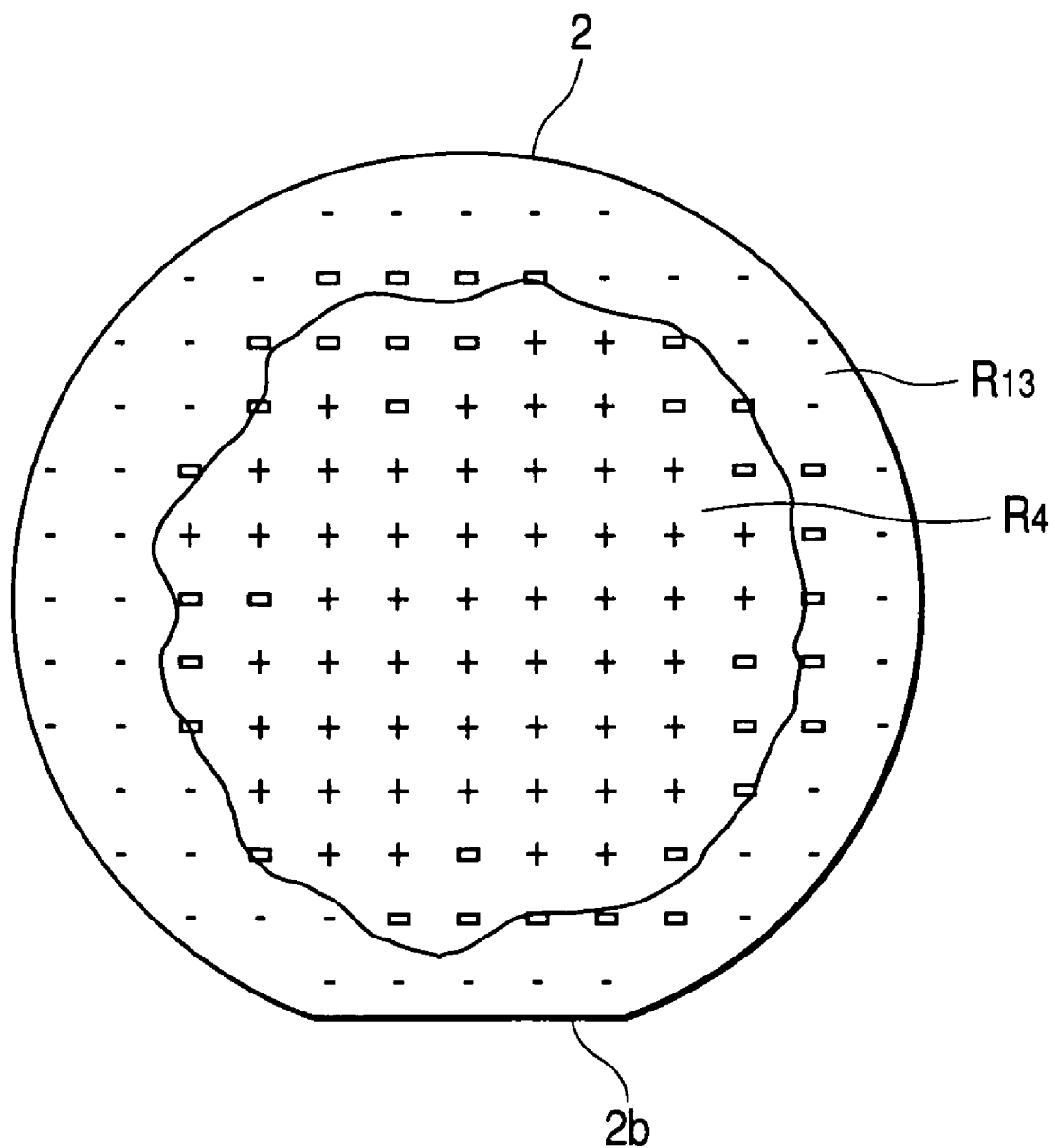
FIG. 14 is a view showing one example of the dose distribution actually obtained after the fourth implantation process, corresponding to FIG. 12.

FIGS. 13 and 14 show examples of the dose distribution actually obtained in the above way. In the FIGS. 13 and 14, minus (−) sign indicates that the dose amount is small, plus (+) sign indicates that the dose amount is large, and rectangle (□) sign indicates that the dose amount is middle.

FIG. 13 corresponds to FIG. 9. In an example of FIG. 13, the ion implantation is made in a state where the orientation flat 2b of the substrate 2 is inclined by 22 degrees in the X direction (same in FIG. 14). Actually, the dose distribution is formed like a river along the Y direction. Also, the dose amount is $d_2$ in the central region $R_2$, and $d_1$ in the regions $R_1$ and $R_3$ on both sides thereof, as previously described.

FIG. 14 corresponds to FIG. 12. However, the position of the orientation flat 2b is coincident with that in FIG. 13. Actually, the dose distribution consists of the central region $R_4$ that is nearly circular and has the large dose amount and the annular peripheral region $R_{13}$ that surrounds it and has the small dose amount. Also, the dose amount is $4d_2$ in the central region $R_4$, and $2d_1+2d_2$ in the peripheral region $R_{13}$, as previously described.

In the case where the dose distribution having different dose amounts between the central region $R_4$ and the peripheral region $R_{13}$ around it is formed in an example of FIG. 14, supposing that the target dose amounts in the central region $R_4$ and the peripheral region $R_{13}$ are $D_A$ and $D_B$, respectively, and the set dose amounts at the first scanning speed $s_1$ and the second scanning speed $s_2$ of the ion beam 4 in one implantation process are $d_1$ and $d_2$, respectively, the set dose amounts $d_1$ and $d_2$ are set in accordance with the following formula, whereby the target dose amounts $D_A$ and $D_B$ are easily attained (realized).

$$d_1=(2D_B-D_A)/n$$

$$d_2=D_A/n \quad \text{[Formula 5]}$$

For example, under the implantation conditions where the diameter of the circular substrate 2 is 20 cm (8 inches), the dose amount $D_A$ in the circular central region is $2.0\times10^{13}/\text{cm}^2$, the dose amount $D_B$ in the annular peripheral region is $1.9\times10^{13}/\text{cm}^2$, the number n of performing the implantation process is 4, and the substrate 2 is rotated by every 90 degrees, the ion implantation is made with the set dose amount $d_1$ of $4.5\times10^{12}/\text{cm}^2$ and the set dose amount $d_2$ of $5.0\times10^{12}/\text{cm}^2$ in accordance with the formula 5, whereby the target dose amounts $D_A$ and $D_B$ are easily realized. The number n, and the set dose amounts $d_1$ and $d_2$ may be set in the control unit 36. The rotation angle $360/n$ in one rotation process may be calculated within the control unit 36.

FIG. 14 shows the results of ion implantation under the above conditions (FIG. 13 shows the results after the first implantation process). The target dose amounts of $2.0\times10^{13}/\text{cm}^2$ in the central region $R_4$ and $1.9\times10^{13}/\text{cm}^2$ in the peripheral region $R_{13}$ were obtained. The radius of the central region was about 6.5 cm.

Also, the dose distribution that is non-uniform within the plane of the substrate 2 may be formed by performing an implantation process of implanting ions into the substrate 2 by changing the driving speed v of the substrate 2 stepwise relatively greatly, while controlling the driving speed v of the substrate 2 to be inversely proportional to the beam current density of the ion beam 4, like a process example as shown in FIG. 8, multiple times, and a rotation process of rotating the substrate 2 around the central part 2a by a predetermined rotation angle in an interval between each implantation process while the ion beam 4 is not applied to the substrate 2. In the example of FIG. 8, the implantation process is formed four times (i.e., implantation process 40, 42, 44 and 46), and the rotation process is performed once in the interval between each implantation process, or three time in total (i.e., rotation process 41, 43 and 45).

In this way, since the implantation process of implanting ions by changing the driving speed v of the substrate 2 stepwise and the rotation process of rotating the substrate 2 around the central part 2a stepwise in the interval between each implantation process are performed multiple times, the dose distribution in rotation symmetry around the central part 2a of the substrate 2 is formed, whereby various dose distributions are further formed within the plane of the substrate 2.

The control unit 36 controls the scan unit, the drive unit 32 and the rotation unit 30 to perform the implantation process and the rotation process in the above way.

The dose distribution having different dose amounts between the central area and its peripheral area within the plane of the substrate may be formed by performing the implantation process of changing the driving speed v of the substrate 2 stepwise from v1, v2 ($\neq$v1) and v3 (=v1) within an area where the ion beam 4 is incident on the substrate 2 n times (n is an integer of two or greater) in the same way as the scanning speed s of the ion beam as shown in FIG. 3, and the rotation process of rotating the substrate 2 by every $360/n$ degrees. In this case, the dose distribution consists of the central region that is nearly circular and the peripheral area that is annular around it in the same way as when the scanning speed s of the ion beam 4 is changed stepwise. The control unit 36 can perform this control.

Also, in this case, supposing that the target dose amounts in the central region and the peripheral region are $D_A$ and $D_B$, respectively, and the set dose amounts at the first driving speed and the second driving speed in one implantation process are $d_1$ and $d_2$, respectively, the set dose amounts $d_1$ and $d_2$ are set in accordance with the formula 5, whereby the target dose amounts $D_A$ and $D_B$ are easily attained (realized)

The dose distribution that is non-uniform within the plane of the substrate 2 may be formed by changing the scanning speed s of the ion beam 4 stepwise as in the above examples and changing the driving speed v of the substrate 2 stepwise as in the above examples at the same time. Since the dose distribution is changed in the X and Y directions within the plane of the substrate 2 in this way, various dose distributions are further formed within the plane of the substrate 2. The control unit 36 can make this control.

The number of performing the implantation process is not limited to 4, but may be any integer of 2 or greater. As the number n is greater, the central region $R_4$ is closer to the circle, and its peripheral region $R_{13}$ is closer to the annulus. For example, n may be 5, 6, 7 or 8.

Also, in the case where the scanning speed of the ion beam 4 is changed, and/or the driving speed v of the substrate 2 is changed, as illustrated in FIGS. 3 to 7, the speed may be changed by setting up the speed change pattern in the control unit 36, which controls the scanning power source 22 and/or the drive unit 32.

The speed change pattern is specifically composed of the positional information indicating the positional relation between the substrate 2 and the ion beam 4 and the speed information at the position. This speed information may be the speed value itself, or the reference speed and variance (or change rate).

Also, in the case when the speed change pattern is stepwise as in the examples of FIGS. 3 and 4, or buckled as in the example of FIG. 7, it is preferred that the speed change curve is created, employing the high-order (e.g., quartic) approximate curve or spline function, to eliminate or obscure the points of inflection in the speed change. In this way, the change in the dose amount between different dose amounts within the plane of the substrate 2 is made smoother. The control unit 36 may perform this processing.

The values of the scanning speed s of the ion beam 4 in the X direction, which are actually acquired on the substrate 2, are obtained by interpolation, employing (1) information of the scanning speeds s at plural points in the X direction on the former stage multi-point Faraday system 38, which are measured employing the former stage multi-point Faraday system 38, (2) information of the scanning speeds s at plural points in the X direction on the latter stage multi-point Faraday system 39, which are measured employing the latter stage multi-point Faraday system 39, and (3) distance between the multi-point Faraday systems 38, 39 and the surface of the substrate 2.

Also, when the scanning speed s actually obtained on the substrate 2 is deviated from the set scanning speed s of the ion beam 4, the control unit 36 controls the scanning power source 22 to shape the waveform of the scan output P(t) supplied from the scanning power source 22 to the scanner 20 to remove the deviation.

Though the ion implantation is usually made over the entire surface of the substrate 2, it may be made in one part within the plane of the substrate 2, as needed.

What is claimed is:

1. An ion implantation method comprising;
   performing an implantation process of implanting ions over an entire substrate, by scanning reciprocatingly an ion beam in an X direction by an electric field or magnetic field and mechanically driving reciprocatingly the substrate in a Y direction substantially orthogonal to the X direction;
   forming a dose distribution that is non-uniform between a center region of the substrate and a peripheral region of the substrate and substantially symmetrical with respect to the center of the substrate within the plane of the substrate to correct a characteristic variation of a semiconductor device caused by at least one process prior to performing the ion implantation process by changing either a scanning speed of the ion beam along the X direction or a driving speed of the substrate along the Y direction while the ion beam is irradiated onto the substrate so that the speed change becomes substantially symmetrical with respect to center of the substrate;
   rotating the substrate around a central part thereof; and
   performing the implantation process at least four times, the substrate being rotated by a predetermined rotation angle around the central part thereof in an interval between each implantation process;
   wherein the resultant substrate has a non-uniform does distribution of a desired pattern within the plane of the substrate.

2. An ion implantation apparatus for implanting ions into a substrate, the apparatus comprising:
   a scan unit for scanning reciprocatingly an ion beam in an X direction by an electric field or magnetic field;
   a drive unit for mechanically driving reciprocatingly the substrate in a Y direction substantially orthogonal to the X direction;
   a rotation unit for rotating the substrate around a central part thereof; and
   a control unit for controlling the rotation unit to rotate the substrate around the central part thereof and for controlling either the scan unit or the drive unit to form a dose distribution that is non-uniform between a center region of the substrate and a peripheral region of the substrate and substantially symmetrical with respect to the center of the substrate within the plane of the substrate to correct a characteristic variation of a semiconductor device caused by at least a process prior to performing the ion implantation process by changing either a scanning speed of the ion beam along the X direction or a driving speed of the substrate along the Y direction while the ion beam is irradiated onto the substrate so that the speed change becomes substantially symmetrical with respect to the center of the substrate,
   wherein the ion implantation apparatus performs an implantation process of implanting ions over the entire substrate at least four times, and the control unit controls the rotation unit to rotate by a predetermined rotation angle the substrate around the central part thereof in an interval between each implantation process;
   wherein the resultant substrate has a two dimensional non-uniform dose distribution of a desired pattern within the plane of the substrate.

3. The ion implantation method according to claim 1, wherein an ion implantation apparatus performs the implantation process n (n is an integer of 2 or greater) times by changing the scanning speed of the ion beam and the substrate is rotated by every 360/n degrees in the interval between each implantation process.

4. The ion implantation method according to claim 3, wherein supposing that target dose amounts in a central region and a peripheral region around the central region within the plane of the substrate are $D_A$ and $D_B$, respectively, and set dose amounts at a first scanning speed and a second scanning speed in one implantation process are $d_1$ and $d_2$, respectively, the set dose amounts $d_1$ and $d_2$ are set in accordance with the following formula, $$d_1=(2D_B-D_A)/n \text{ and}$$

$$d_2=D_A/n.$$

5. The ion implantation apparatus according to claim 2, wherein the implantation process is performed n (n is an integer of 2 or greater) times, and wherein the control unit controls the scan unit to change the scanning speed of the ion beam, and the control unit controls the rotation unit to rotate the substrate by every 360/n degrees in the interval between each implantation process.

6. The ion implantation method according to claim 1, wherein an ion implantation apparatus performs the implantation process n (n is an integer of 2 or greater) times by changing stepwise the driving speed of the substrate, and the substrate is rotated by every 360/n degrees in the interval between each implantation process.

7. The ion implantation method according to claim 6, wherein supposing that target dose amounts in a central region and a peripheral region around the central region within the plane of the substrate are $D_A$ and $D_B$, respectively, and set dose amounts at a first driving speed and a second driving speed in one implantation process are $d_1$ and $d_2$, respectively, the set dose amounts $d_1$ and $d_2$ are set in accordance with the following formula, $$d_1=(2D_B-D_A)/n \text{ and}$$

$$d_2=D_A/n.$$

8. The ion implantation apparatus according to claim 2, wherein the implantation process is performed n (n is an integer of 2 or greater) times, and wherein the control unit controls the drive unit to change the driving speed of the substrate, and the control unit controls the rotation unit to rotate the substrate by every 360/n degrees in the interval between each implantation process.

9. An ion implantation method comprising;
   performing an implantation process of implanting ions over an entire substrate, by mechanically driving reciprocatingly the substrate in a Y direction substantially orthogonal to a X direction of an ion beam;
   forming a dose distribution that is non-uniform between a center region of the substrate and a peripheral region of the substrate and substantially symmetrical with respect to the center of the substrate within the plane of the substrate to correct a characteristic variation of a semiconductor device caused by a process prior to performing the ion implantation process by changing a driving speed of the substrate along the Y direction while the ion beam is irradiated onto the substrate so that the speed change becomes substantially symmetrical with respect to the center of the substrate;
   rotating the substrate around a central part thereof; and
   performing the implantation process at least four times, the substrate being rotated by a predetermined rotation angle around the central part thereof in an interval between each implantation process;
   wherein the resultant substrate has a two dimensional non-uniform does distribution of a desired pattern within the plane of the substrate.

10. An ion implantation apparatus for implanting ions into a substrate, the apparatus comprising;
    a drive unit for mechanically driving reciprocatingly the substrate in a Y direction substantially orthogonal to a X direction of an ion beam;
    a rotation unit for rotating the substrate around a central part thereof; and
    a control unit for controlling the rotation unit to rotate the substrate around the central part thereof and for controlling the drive unit to form a dose distribution that is non-uniform between a center region of the substrate and a peripheral region of the substrate and substantially symmetrical with respect to the center of the substrate within the plane of the substrate to correct a characteristic variation of a semiconductor device caused by a process prior to performing the ion implantation process by changing a a driving speed of the substrate along the Y direction while the ion beam is irradiated onto the substrate so that the speed change becomes substantially symmetrical with respect to the center of the substrate,
    wherein the ion implantation apparatus performs an implantation process of implanting ions over the entire substrate at least four times, and the control unit controls the rotation unit to rotate by a predetermined rotation angle the substrate around the central part thereof in an interval between each implantation process;
    wherein the resultant substrate has a two dimensional non-uniform dose distribution of a desired pattern within the plane of the substrate.

11. The ion implantation method according to claim 9, wherein an ion implantation apparatus performs the implantation process n (n is an integer of 2 or greater) times by changing the driving speed of the substrate, and the substrate is rotated by every 360/n degrees in the interval between each implantation process.

12. The ion implantation method according to claim 11, wherein supposing that target dose amounts in a central region and a peripheral region around the central region within the plane of the substrate are $D_A$ and $D_B$, respectively, and set dose amounts at a first driving speed and a second driving speed in one implantation process are $d_1$ and $d_2$, respectively, the set dose amounts $d_1$ and $d_2$ are set in accordance with the following formula, $$d_1 = (2D_B - D_A)/n \text{ and}$$

$$d_2 = D_A/n.$$

13. The ion implantation apparatus according to claim 10, wherein the implantation process is performed n (n is an integer of 2 or greater) times, and wherein the control unit controls the drive unit to change the driving speed of the substrate, and the control unit controls the rotation unit to rotate the substrate by every 360/n degrees in the interval between each implantation process.

* * * * *

UNITED STATES PATENT AND TRADEMARK OFFICE
CERTIFICATE OF CORRECTION

PATENT NO. : 8,017,922 B2
APPLICATION NO. : 10/840281
DATED : September 13, 2011
INVENTOR(S) : Takao Matsumoto and Nobuo Nagai It is certified that error appears in the above-identified patent and that said Letters Patent is hereby corrected as shown below:

Claim 1, col. 13, line 47, "to center of" should read -- to the center of --.

Claim 1, col. 13, line 53, "does distribution" should read -- dose distribution --.

Claim 6, col. 14, line 50, delete "stepwise" after -- changing --.

Claim 9, col. 15, line 27, "non-uniform does" should read -- non-uniform dose --.

Claim 10, col. 16, line 3, "changing a a driving speed" should read -- changing a driving speed --.

Signed and Sealed this
Twenty-seventh Day of December, 2011

David J. Kappos
*Director of the United States Patent and Trademark Office*